US010307990B2

(12) United States Patent
Kakiuchi et al.

(10) Patent No.: US 10,307,990 B2
(45) Date of Patent: Jun. 4, 2019

(54) EPOXY RESIN COMPOSITION, PREPREG, RESIN-COATED METAL FOIL, RESIN SHEET, LAMINATE AND MULTILAYER BOARD

(75) Inventors: Hidetaka Kakiuchi, Sukagawa (JP); Yoshihiko Nakamura, Sukagawa (JP); Shunji Araki, Koriyama (JP); Yuki Miyoshi, Koriyama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 859 days.

(21) Appl. No.: 13/258,402

(22) PCT Filed: Feb. 2, 2010

(86) PCT No.: PCT/JP2010/051371
§ 371 (c)(1),
(2), (4) Date: Sep. 21, 2011

(87) PCT Pub. No.: WO2010/109948
PCT Pub. Date: Sep. 30, 2010

(65) Prior Publication Data
US 2012/0006588 A1    Jan. 12, 2012

(30) Foreign Application Priority Data

Mar. 26, 2009  (JP) ................ 2009-077519
Mar. 26, 2009  (JP) ................ 2009-077526

(51) Int. Cl.
| | |
|---|---|
| B32B 27/38 | (2006.01) |
| B32B 15/092 | (2006.01) |
| C08G 59/40 | (2006.01) |
| C08G 59/62 | (2006.01) |
| C08G 59/68 | (2006.01) |
| C08J 5/24 | (2006.01) |
| H05K 1/03 | (2006.01) |
| B32B 15/14 | (2006.01) |
| C08G 59/14 | (2006.01) |
| C08L 63/00 | (2006.01) |
| B32B 7/12 | (2006.01) |
| B32B 27/10 | (2006.01) |
| B32B 27/12 | (2006.01) |
| B32B 27/28 | (2006.01) |
| B32B 27/36 | (2006.01) |
| B32B 29/00 | (2006.01) |
| C08K 5/49 | (2006.01) |

(52) U.S. Cl.
CPC .......... *B32B 15/092* (2013.01); *B32B 7/12* (2013.01); *B32B 15/14* (2013.01); *B32B 27/10* (2013.01); *B32B 27/12* (2013.01); *B32B 27/281* (2013.01); *B32B 27/36* (2013.01); *B32B 27/38* (2013.01); *B32B 29/002* (2013.01); *C08G 59/1488* (2013.01); *C08G 59/4021* (2013.01); *C08G 59/62* (2013.01); *C08G 59/686* (2013.01); *C08J 5/24* (2013.01); *C08L 63/00* (2013.01); *H05K 1/0326* (2013.01); *B32B 2255/06* (2013.01); *B32B 2255/10* (2013.01); *B32B 2255/26* (2013.01); *B32B 2260/023* (2013.01); *B32B 2260/046* (2013.01); *B32B 2262/02* (2013.01); *B32B 2262/101* (2013.01); *B32B 2307/204* (2013.01); *B32B 2307/306* (2013.01); *B32B 2307/3065* (2013.01); *B32B 2307/732* (2013.01); *B32B 2457/08* (2013.01); *C08J 2363/00* (2013.01); *C08K 5/49* (2013.01); *H05K 2201/012* (2013.01); *Y10T 428/31529* (2015.04)

(58) Field of Classification Search
None
See application file for complete search history.

(56) References Cited

U.S. PATENT DOCUMENTS

| | | | |
|---|---|---|---|
| 5,834,565 A | 11/1998 | Tracy et al. | |
| 6,214,455 B1 * | 4/2001 | Honda ................ | C08G 59/38 257/E23.007 |
| 7,671,147 B2 | 3/2010 | Urakawa et al. | |

(Continued)

FOREIGN PATENT DOCUMENTS

| | | |
|---|---|---|
| EP | 1775321 A1 | 4/2007 |
| JP | 9-124806 A | 5/1997 |

(Continued)

OTHER PUBLICATIONS

Lin et al., "Phosphorus-Containing Epoxy Curing Agents via Imine Linkage", Macromol. Chem. Phys. 2007, 208, 2628-2641.*
Abe et al. JP2008-050526 machine translation, Mar. 6, 2008.*
Chemical Book—poly(2 6-dimethyl-1,4-phenylene oxide). Retrieved on Jan. 3, 2013.*
Fukuoka et al., Machine translation of JP 2004331958. Nov. 24, 2004.*

(Continued)

*Primary Examiner* — Coris Fung
(74) *Attorney, Agent, or Firm* — McDermott Will & Emery LLP

(57) ABSTRACT

An epoxy resin composition contains a polyfunctional epoxy resin (A), a polyphenylene ether compound (B) and a phosphorus-modified curing agent (C). A polyphenylene ether (B1) having a number-average molecular weight of 500 to 3000 and an average of 1.0 to 3.0 hydroxyl groups per molecule, and an epoxy resin (B2) obtained by reacting this polyphenylene ether (B1) with an epoxy resin (D) having an average of 2.3 or fewer epoxy groups per molecule and the like, are included as the polyphenylene ether compound (B). A phosphorus-modified epoxy resin (P) is included in at least one selected from the polyfunctional epoxy resin (A), the epoxy resin (D) and a component other than the (A), (B) and (C) above. The phosphorus content is 1.5 to 4.5 mass % as a percentage of the resin solids in the epoxy resin composition.

30 Claims, No Drawings

(56) References Cited

U.S. PATENT DOCUMENTS

| | | | |
|---|---|---|---|
| 2003/0162935 A1* | 8/2003 | Sagara et al. | 528/108 |
| 2004/0147715 A1 | 7/2004 | Ishii et al. | |
| 2007/0093614 A1* | 4/2007 | Uchida et al. | 525/396 |
| 2007/0221890 A1* | 9/2007 | Gan | C07F 9/6571 |
| | | | 252/601 |
| 2008/0050596 A1 | 2/2008 | Urakawa et al. | |
| 2009/0018303 A1* | 1/2009 | Onizuka | C08G 59/621 |
| | | | 528/88 |
| 2011/0223539 A1* | 9/2011 | Kurafuchi et al. | 430/280.1 |

FOREIGN PATENT DOCUMENTS

| | | | |
|---|---|---|---|
| JP | 11-302529 A | 11/1999 | |
| JP | 2002-249552 A | 9/2002 | |
| JP | 2003-342349 A | 12/2003 | |
| JP | 2004-217854 A | 8/2004 | |
| JP | 2004-231728 A | 8/2004 | |
| JP | 2004-256717 A | 9/2004 | |
| JP | 2004331958 * | 11/2004 | |
| JP | 3879831 B2 | 11/2006 | |
| JP | 2008-501063 A | 1/2008 | |
| JP | 2008-50526 A | 3/2008 | |
| JP | 2009001787 * | 1/2009 | |
| WO | WO 2007097231 A1 * | 8/2007 | C08G 59/621 |

OTHER PUBLICATIONS

Yamada et al., Machine translation of JP 2009001787, Jan. 8, 2009.*
Dictionary.com: Compatible. Retrieved on Sep. 15, 2016.*
Bishop: Addition (Chain Growth) Polymer. 2013. http://preparatorychemistry.com/Bishop_Addition_Polymers.htm.*
International Search Report for the Application No. PCT/JP2010/051371 dated Apr. 20, 2010.
European Office Communication issued in European Patent Application No. 10 755 749.8 dated Jan. 15, 2014.

* cited by examiner

EPOXY RESIN COMPOSITION, PREPREG, RESIN-COATED METAL FOIL, RESIN SHEET, LAMINATE AND MULTILAYER BOARD

TECHNICAL FIELD

The present invention relates to an epoxy resin composition, a prepreg, a resin-coated metal foil, a resin sheet, a laminate and a multilayer board.

BACKGROUND ART

Because the copper clad laminates used in electronic and electrical devices are subject to strict safety requirements to prevent and retard fires, epoxy resin compositions with introduced bromine and other halogen atoms are widely used for purposes of flame retardancy. It is relatively easy to increase the bromine content of epoxy resin, and a high glass transition temperature, heat resistance and other necessary properties of laminates can be achieved by combining a highly-brominated epoxy resin with a non-brominated epoxy resin or less-brominated epoxy resin.

For environmental reasons, epoxy resin compositions having phosphorus atoms introduced into the epoxy resin instead of bromine and other halogen atoms have become popular in recent years. A technique has also been proposed for introducing phosphorus atoms into the curing agent (Patent Document 1).

In recent years, however, signal transmission speeds have increased in the telecommunications and other fields, and when signal frequencies are increased as a result there is generally more transmission loss, which interferes with device functions. It has therefore become necessary to minimize transmission loss by using materials with low dielectric constants and dielectric tangents in the multilayer boards of printed wiring boards.

However, epoxy resin compositions having introduced phosphorus atoms in place of halogen atoms tend to have poor dielectric properties, with higher dielectric constants and dielectric tangents.

Two techniques that have been proposed for improving the dielectric properties of epoxy resin compositions and the like are to use a polyphenylene ether having hydroxyl groups as the curing agent (Patent Documents 2, 3), and to use an epoxy resin comprising a glycidylated polyphenylene ether having hydroxyl groups (Patent Document 4).

Patent Document 1: Japanese Translation of PCT Application No. 2008-501063
Patent Document 2: Japanese Patent Application Laid-open No. 2004-231728
Patent Document 3: Japanese Patent Application Laid-open No. 2004-217854
Patent Document 4: Japanese Patent Publication No. 3879831

However, when the curing agent is a polyphenylene ether having hydroxyl groups, adhesiveness is poor because of the polyphenylene ether structure, and poor interlayer adhesiveness has been a problem with these epoxy resin compositions. Another problem has been incompatibility in epoxy resin compositions containing phosphorus atoms.

DISCLOSURE OF THE INVENTION

In light of the circumstances described above, it is an object of the present invention to provide an epoxy resin composition having the necessary flame retardancy and heat resistance for a laminate or multilayer board, and having superior dielectric properties without any loss of interlayer adhesiveness, along with a prepreg, a resin-coated metal foil, a resin sheet, a laminate and a multilayer board using the composition.

To achieve this object, the present invention features the following.

First, the epoxy resin composition of the present invention contains a polyfunctional epoxy resin (A), a polyphenylene ether compound (B), and a phosphorus-modified curing agent (C). At least one selected from a polyphenylene ether (B1) having a number-average molecular weight of 500 to 3000 and an average of 1.0 to 3.0 hydroxyl groups per molecule, and an epoxy resin (B2) obtained by reacting this polyphenylene ether (B1) with an epoxy resin (D) having an average of 2.3 or fewer epoxy groups per molecule, is included as the polyphenylene ether compound (B). Moreover, a phosphorus-modified epoxy resin (P) is included in at least one selected from the polyfunctional epoxy resin (A), the epoxy resin (D), and a component other than the (A), (B) and (C). The phosphorus content is 1.5 to 4.5 mass % as a percentage of resin solids in the epoxy resin composition. The epoxy resin composition has the features given above.

Second, in the epoxy resin composition of the first invention, polyphenylene ether (B1) has a number-average molecular weight of 500 to 2000 and an average of 1.5 to 2.5 hydroxyl groups per molecule.

Third, in the epoxy resin composition of the first or second invention, the composition includes, as the phosphorus-modified epoxy resin (P), a phosphorus-modified epoxy resin obtained by reacting an epoxy resin including a novolac epoxy resin or a bifunctional epoxy resin with a reaction product of a quinone compound and an organic phosphorus compound represented by Formula (I) below:

[C1]

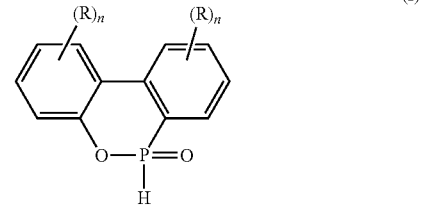

(wherein each R independently represents hydrogen or a $C_{1-6}$ hydrocarbon group, and n is an integer from 0 to 4).

Fourth, in any of the epoxy resin compositions of the first to third inventions, at least one selected from a cresol novolac epoxy resin and a phenol novolac epoxy resin is included as the polyfunctional epoxy resin (A).

Fifth, in any of the epoxy resin compositions of the first to fourth inventions, the composition includes, as the phosphorus-modified curing agent (C), a phosphorous-modified curing agent obtained by reacting an organic phosphorus compound represented by Formula (I) below:

[C2]

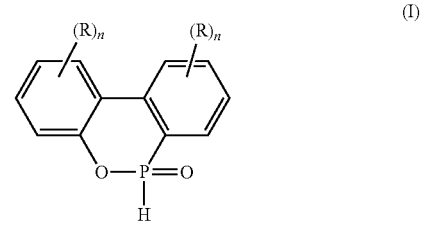

(wherein each R independently represents hydrogen or a $C_{1-6}$ hydrocarbon group, and n is an integer from 0 to 4) with a compound obtained by etherifying, with at least one monomer alcohol, a condensation product of a reaction between phenols and formaldehyde.

Sixth, in any of the epoxy resin compositions of the first to fifth inventions, the epoxy resin (D) having an average of 2.3 or fewer epoxy groups per molecule is included as a component other the (A), (B) and (C) above.

Seventh, in any of the epoxy resin compositions of the first to sixth inventions, the curing agent (E) containing no phosphorus atoms is also included.

Eighth, in any of the epoxy resin compositions of the first to seventh inventions, an inorganic filler is included in an amount of 35 to 350 mass % of the resin solids.

Ninth, the prepreg of the present invention is obtained by drying a base material that has been impregnated with the epoxy resin composition of any of the first to eighth inventions.

Tenth, the resin-coated metal foil of the present invention is obtained by drying a metal foil that has been coated with the epoxy resin composition of any of the first to eighth inventions.

Eleventh, the resin sheet of the present invention is obtained by drying an organic film that has been coated with an epoxy resin composition of any of the first to eighth inventions.

Twelfth, the laminate of the present invention comprises a desired number of at least one selected from the prepreg of the ninth invention, the resin-coated metal foil of the tenth invention and the resin sheet of the eleventh invention, which have been stacked, heated, pressed and laminate molded.

Thirteenth, the multilayer board of the present invention comprises at least one selected from the prepreg of the ninth invention, the resin-coated metal foil of the tenth invention and the resin sheet of the eleventh invention, which have been laid over an inner-layer circuit board, and heated, pressed and laminate molded.

With the first invention described above, the necessary flame retardancy and heat resistance for a laminate or multilayer board can be ensured without using an epoxy resin with introduced bromine or other halogen atoms. Moreover, the dielectric properties can be improved by using at least one selected from polyphenylene ether (B1) having a number-average molecular weight of 500 to 3000 and an average of 1.0 to 3.0 hydroxyl groups per molecule and epoxy resin (B2) obtained by reacting this polyphenylene ether (B1) with epoxy resin (D) having an average of 2.3 or fewer epoxy groups per molecule as polyphenylene compound (B), while a decrease in interlayer adhesiveness can be prevented by also including phosphorus-modified curing agent (C).

With the second invention described above, in addition to the effects of the first invention, polymerization can be controlled during manufacture of epoxy resin (B2) and compatibility with the epoxy resin can be increased by using a polyphenylene ether (B1) with a number-average molecular weight of 500 to 2000.

With the third invention described above, in addition to the effects of the first and second invention, a decrease in the glass transition temperature after moisture absorption can be controlled in particular and the reflow heat resistance after moisture absorption can be increased if phosphorus-modified epoxy resin (P) is as described above.

With the fourth invention described above, in addition to the effects of the first to third inventions, the glass transition temperature can be increased by also using at least one selected from the cresol novolak epoxy resins and phenol novolak epoxy resins as polyfunctional epoxy resin (A).

With the fifth invention described above, in addition to the effects of the first to fourth inventions, the glass transition temperature can be adjusted to a high value suited to a laminate or multilayer board by using the agent described above as phosphorus-modified curing agent (C) in combination with the aforementioned components (A) and (B).

With the sixth invention described above, in addition to the effects of the first to fifth inventions, a good balance of the necessary properties for a laminate or multilayer board can be obtained by including epoxy resin (D) having an average of 2.3 or fewer epoxy groups per molecule as a component other than the aforementioned components (A), (B) and (C).

With the seventh invention described above, in addition to the effects of the first to sixth inventions, a good balance of the necessary properties for a laminate or multilayer board can be obtained by also including curing agent (E) containing no phosphorus atoms.

With the eighth invention described above, in addition to the effects of the first to seventh inventions, the dielectric properties can be further improved by including an inorganic filler in the amount of 35 to 350 mass % of the resin solids.

Because the ninth invention described above is obtained by drying a base material that has been impregnated with an epoxy resin composition of any of the first to eighth invention, the necessary flame retardancy and heat resistance for a laminate or multilayer board can be ensured without using an epoxy resin with introduced bromine or other halogen atoms, the dielectric properties can be improved, and a decrease in interlayer adhesiveness can be prevented.

Because the tenth invention described above is obtained by drying a metal foil that has been coated with an epoxy resin composition of any of the first to eighth inventions, the necessary flame retardancy and heat resistance for a laminate or multilayer board can be ensured without using an epoxy resin with introduced bromine or other halogen atoms, the dielectric properties can be improved, and a decrease in interlayer adhesiveness can be prevented.

Because the eleventh invention described above is obtained by drying an organic film that has been coated with an epoxy resin composition of any of the first to eighth inventions, the necessary flame retardancy and heat resistance for a laminate or multilayer board can be ensured without using an epoxy resin with introduced bromine or other halogen atoms, the dielectric properties can be improved, and a decrease in interlayer adhesiveness can be prevented.

Because the twelfth invention described above comprises a desired number of at least one selected from the prepreg of the ninth invention, the resin-coated metal foil of the tenth invention and the resin sheet of the eleventh invention which have been stacked, heated, pressed and laminate molded, the necessary flame retardancy and heat resistance for a laminate or multilayer board can be ensured without using an epoxy resin with introduced bromine or other halogen atoms, the dielectric properties can be improved, and a decrease in interlayer adhesiveness can be prevented.

Because the thirteenth invention described above comprises at least one selected from the prepreg of the ninth invention, the resin-coated metal foil of the tenth invention and the resin sheet of the eleventh invention, laid over an inner-layer circuit board and heated, pressed and laminate molded, the necessary flame retardancy and heat resistance for a laminate or multilayer board can be ensured without using an epoxy resin with introduced bromine or other halogen atoms, the dielectric properties can be improved, and a decrease in interlayer adhesiveness can be prevented.

BEST MODE FOR CARRYING OUT THE INVENTION

The present invention is explained in detail below.

Polyfunctional phosphorus-modified epoxy resin (A1), which is one kind of phosphorus-modified epoxy resin (P), can be used as the polyfunctional epoxy resin (A) used in the present invention. Phosphorus-modified epoxy resin (P) is an epoxy resin containing phosphorus atoms. In the present invention, a polyfunctional epoxy resin is an epoxy resin having an average of 3 or more epoxy groups per molecule.

The phosphorus-modified epoxy resin (P) used in the present invention can be a resin obtained by reacting an epoxy resin with the reaction product of an organic phosphorus compound and a quinone compound.

For purposes of increasing the glass transition temperature after moisture absorption and providing good solubility with a high phosphorus content, the organic phosphorus compound is preferably the organic phosphorus compound of Formula (I) above. In Formula (I) above, each R independently represents hydrogen or a $C_{1-6}$ hydrocarbon group, and preferably represents a $C_{1-6}$ straight-chain or branched alkyl group. n is an integer from 0 to 4. A preferred specific example of the organic phosphorus compound of Formula (I) above is 3,4,5,6-dibenzo-1,2-oxaphosphane-2-oxide.

Diphenylphosphine oxide or the like can also be used as the organic phosphorus compound.

Specific examples of the quinone compound that is reacted with the organic phosphorus compound include 1,4-benzoquinone, 1,2-benzoquinone, toluqinone, 1,4-napththoquinone and the like. One of these may be used alone, or two or more may be combined.

For purposes of ensuring the heat resistance of the cured product and raising the glass transition temperature in particular, a phenol novolac epoxy resin, cresol novolac epoxy resin or other novolac epoxy resin can be used by preference as the epoxy resin that is a raw material of phosphorus-modified epoxy resin (P). The novolac epoxy resin is preferably compounded at the rate of at least 20 mass % (maximum 100 mass %) of the total epoxy resin. Polyfunctional phosphorus-modified epoxy resin (A1) can be obtained by selecting appropriate polyfunctional epoxy resin.

Similarly, the bifunctional phosphorus-modified epoxy resin (D1) described below can be obtained by selecting appropriate epoxy resin including bifunctional epoxy resin. The bifunctional epoxy resin is preferably compounded at the rate of at least 20 mass % (maximum 100 mass %) of the total epoxy resin.

When the epoxy resin that is a raw material of phosphorus-modified epoxy resin (P) consists entirely of a mixture containing novolac epoxy resin, specific examples of epoxy resins other than novolac epoxy resins include those having 2 or more epoxy groups per molecule, such as bisphenol epoxy resin, resorcin epoxy resin, polyglycol epoxy resin, fluorene epoxy resin and the like. Examples of bifunctional epoxy resins include bisphenol A epoxy resin, bisphenol F epoxy resin, biphenyl epoxy resin and the like.

Phosphorus-modified epoxy resin (P) can be obtained for example by first reacting the aforementioned organic phosphorus compound and quinone compound in a solvent such as toluene, and then mixing the reaction product with epoxy resin and reacting the two.

For example, when using the organic phosphorus compound of Formula (I) above, a reaction between the organic phosphorus compound and a quinone compound can be accomplished using in the range of 1 to 2 moles of the organic phosphorus compound per 1 mole of the quinone compound, by adding the quinone compound to a solution of the organic phosphorous compound dissolved in advance in an inactive solvent such as dioxane, benzene, toluene, xylene or the like, and heating and agitating the two.

The quinone compound can be pulverized or dissolved in a solvent before being added. Because heat is generated by the reaction between the organic phosphorus compound and quinone compound, moreover, it is desirable to add a specific amount of the quinone compound by the falling-drop method so that too much heat is not generated. After addition of the quinone compound, the reaction is continued for 1 to 4 hours at 50 to 150° C. for example.

Next, when synthesizing phosphorus-modified epoxy resin (P) by reacting an epoxy resin with the reaction product of the organic phosphorus compound and quinone compound, the epoxy resin is added to the reaction product, a catalyst such as triphenylphosphine is added as necessary, and the reaction is performed with agitation with the reaction temperature set to 100 to 200° C. for example.

In order to ensure flame retardancy and prevent a depression in heat resistance, the phosphorus content of a phosphorus-modified epoxy resin (P) obtained in this way is preferably adjusted to 1.2 to 4 mass % and the epoxy equivalent is adjusted to 200 to 600 g/eq by adjusting the synthesis conditions appropriately.

Epoxy resin (A2), which is an epoxy resin other than phosphorus-modified epoxy resin (P) that is polyfunctional and does not contain phosphorus atoms, can also be used as the polyfunctional epoxy resin (A) used in the present invention. When polyfunctional phosphorus-modified epoxy resin (A1) is not used, however, phosphorus-modified epoxy resin (P) must be included in a component other than polyfunctional epoxy resin (A) in the epoxy resin composition as a whole. Polyfunctional phosphorus-modified epoxy resin (A1) and epoxy resin (A2) containing no phosphorus atoms may also be compounded together.

A good balance of the properties necessary for a laminate or multilayer board can be obtained by compounding epoxy resin (A2) containing no phosphorus atoms. Specific examples of this epoxy resin (A2) containing no phosphorus atoms include cresol novolac epoxy resin, phenol novolac epoxy resin and other novolac epoxy resins, bisphenol A epoxy resin, bisphenol F epoxy resin and other bisphenol epoxy resins, and dicyclopentadiene epoxy resin and the like. One of these may be used alone, or two or more may be combined.

Of these, one containing no bromine or other halogen atoms is preferred from an environmental standpoint. For purposes of ensuring the heat resistance of the cured epoxy resin composition and increasing the glass transition temperature in particular, a cresol novolac epoxy resin, phenol novolac epoxy resin or other novolac epoxy resin is preferred.

A bifunctional epoxy resin (D) may also be compounded in addition to the polyfunctional epoxy resin (A) used in the present invention. A better balance of the properties necessary for a laminate or multilayer board can be obtained by compounding bifunctional epoxy resin (D). Bifunctional epoxy resin (D) may be similar to the bifunctional epoxy resins described above. Bifunctional phosphorus-modified epoxy resin (D1) may also be used as bifunctional epoxy resin (D) in the present invention. Flame retardancy and heat resistance can be ensured in this way. In the present invention, a bifunctional epoxy resin is an epoxy resin having an average of 2.3 or fewer epoxy groups per molecule.

The preferred content of polyfunctional epoxy resin (A) is 5 to 80 mass % as a percentage of the total resin solids in the epoxy resin composition. The preferred content of bifunctional epoxy resin (D) is 0 to 80 mass % as a percentage of the total resin solids in the epoxy resin composition. A good balance of the necessary properties for a laminate or multilayer board can be obtained by compounding these components in these amounts.

Polyphenylene ether compound (B) used in the present invention is a polyphenylene ether or a reaction product thereof.

Either polyphenylene ether (B1) having a number-average molecular weight of 500 to 3000 and an average of 1.0 to 3.0 hydroxyl groups per molecule or epoxy resin (B2) obtained by reacting this polyphenylene ether (B1) with epoxy resin (D) having an average of 2.3 or fewer epoxy groups per molecule is used as polyphenylene ether compound (B). Either (B1) or (B2) may be included, or both may be combined.

In the present invention, the dielectric properties can be enhanced by using such a polyphenylene ether compound (B).

When the aforementioned polyphenylene ether (B1) is used as polyphenylene ether compound (B), polyphenylene ether compound (B) functions as a curing agent (polyphenylene ether curing agent). When the reaction product of this polyphenylene ether (B1) and epoxy resin (D) (epoxy resin (B2) above) is used as polyphenylene ether compound (B), polyphenylene ether compound (B) functions as an epoxy resin. Thus, polyphenylene ether (B1) is included as either a curing agent or a resin component in the present invention.

For example, polyphenylene ether (B1) having an average of 1.0 to 3.0 hydroxyl groups per molecule may be one having an —O—X—O— structure as a constituent unit of a straight-chain structure. X in this case may an optionally substituted phenylene group, or a bivalent group comprising two optionally substituted phenylene groups bound by a straight-chain, branched or cyclic hydrocarbon with 20 or fewer carbon atoms or the like. A substituent in a phenylene group may be a hydroxyl group or an alkyl or phenyl group with 6 or fewer carbon atoms or the like.

The number-average molecular weight of polyphenylene ether (B1) is 500 to 3000. If the molecular weight of the polyphenylene ether is less than 500 there are more hydroxyl groups, and it may be harder to reduce the dielectric constant. If the molecular weight of the polyphenylene ether is over 3000, compatibility with the epoxy resin may be less. In particular, compatibility with an epoxy resin that has been phosphorus modified may be much lower.

Moreover, in the present invention the aforementioned polyphenylene ether (B1) is preferably one having a number-average molecular weight of 500 to 2000 and an average of 1.5 to 2.5 hydroxyl groups per molecule. Compatibility with the epoxy resin can be especially increased by using such a polyphenylene ether (B1), and polymerization can be controlled when manufacturing an epoxy resin by reacting polyphenylene ether (B1) with epoxy resin (D).

The number-average molecular weight is determined by gel permeation chromatography. The presence of an average of 1.0 to 3.0 (or an average of 1.5 to 2.5) hydroxyl groups per molecule is confirmed for example from the number of hydroxyl groups in the polyphenylene ether raw material in the case of (B1), or is calculated from the theoretical value in the case of (B2).

Compatibility with the epoxy resin is greater when the aforementioned polyphenylene ether (B1) itself is used as polyphenylene ether compound (B). In this case, there is no depression in adhesiveness even if the epoxy resin composition has a sea-island structure, and delamination and other loss of physical properties can be controlled. Moreover, compatibility can be easily improved without necessarily having to prepare the aforementioned epoxylated reaction product (B2).

Compatibility can be further enhanced and miscibility with phosphorus-modified epoxy resin (P) and other resin components can be achieved by using, as polyphenylene ether compound (B), epoxy resin (B2) obtained by reacting polyphenylene ether (B1) with epoxy resin (D) having an average of 2.3 or fewer epoxy groups per molecule. The preferred lower limit on the number of epoxy groups in this epoxy resin (D) is an average of 2 or more per molecule.

The presence of an average of 2.3 or fewer epoxy groups per molecule can be confirmed from the epoxy equivalent measurement results (JIS K 7236) for the reaction product after reacting polyphenylene ether compound (B1) with epoxy resin (D) with 2.3 or fewer epoxy groups as the raw material. It can also be verified theoretically given 2.3 or less as the number of epoxy groups in one molecule of the raw material making up the epoxy resin.

The epoxy resin (D) with an average of 2.3 or fewer epoxy groups per molecule that is reacted with polyphenylene ether (B1) is not particularly limited as long as it has 2 or more epoxy groups per molecule, but examples include bisphenol A epoxy resin, bisphenol F epoxy resin, biphenyl epoxy resin and the like. One of these may be used alone, or two or more may be combined.

Bifunctional phosphorus-modified epoxy resin (D1), which is a kind of phosphorus-modified epoxy resin (P), can also be used as epoxy resin (D) for reacting with polyphenylene ether (B1). In the present invention, phosphorus-modified epoxy resin (P) can be included in polyfunctional epoxy resin (A), in the aforementioned epoxy resin (D) constituting (B), or in another epoxy resin. Of course, phosphorus-modified epoxy resin (P) may be included in more than one of these components.

The reaction between polyphenylene ether (B1) and epoxy resin (D) having 2.3 or fewer epoxy groups per molecule can be accomplished for example by setting the compounded amounts according to the equivalent ratio, dissolving them in an inactive solvent such as dioxane, benzene, toluene or xylene, adding an imidazole compound or other curing accelerator as necessary, and then agitating with the reaction temperature set at 100 to 200° C.

The content of polyphenylene ether compound (B) is preferably set so that polyphenylene ether (B1) constitutes 5 to 80 mass % of the total resin solids in the epoxy resin composition. If the compounded amount of polyphenylene ether (B1) is within this range, it will be easier to obtain a laminate or multilayer board with superior dielectric properties and interlayer adhesiveness.

The phosphorus-modified curing agent (C) used in the present invention is a kind of curing agent having active hydrogen. Phosphorus-modified curing agent (C) is a curing agent containing phosphorus atoms. By using phosphorus-modified curing agent (C), it is possible to reliably ensure the flame retardancy and heat resistance necessary for a laminate or multilayer board, while improving the dielectric properties by using polyphenylene ether compound (B) with a number-average molecular weight of 500 to 3000.

A preferred example of phosphorus-modified curing agent (C) used in the present invention is obtained by reacting an organic phosphorus compound with a compound (hereunder called "compound (F)") obtained by using at least one kind of monomer alcohol to etherify a condensation product of a reaction between phenols and formaldehyde. Specifically, the phosphorus-modified curing agent described in Japanese Translation of PCT Application No. 2008-501063 can be used as phosphorus-modified curing agent (C).

Specific examples of the phenol include phenol, cresol, xylenol, bisphenol A and the like. One of these may be used alone, or two or more may be combined.

These phenols and formaldehyde are first reacted to obtain a condensation product comprising one or two or more monomers, dimers or higher n-mers, and this reaction product is partially or wholly etherified with at least one kind of monomer alcohol to obtain compound (F). Compound (F) having methylene bonds and/or dimethylene ether bonds and having OH groups on a benzene ring can be obtained in this way.

Specific examples of the aforementioned monomer alcohol include methyl alcohol, ethyl alcohol, propyl alcohol, isopropyl alcohol, butyl alcohol, isobutyl alcohol, pentyl alcohol, hexyl alcohol, heptyl alcohol, octyl alcohol and other $C_{1-20}$ straight-chain or branched alcohols and the like. One of these may be used alone, or two or more may be combined.

The phosphorus-modified curing agent (C) obtained in this way has a number-average molecular weight of preferably 50 to 10000 and a weight-average molecular weight of preferably 100 to 15000.

The organic phosphorus compound of Formula (I) above is preferably used as the organic phosphorus compound, and a specific example is 3,4,5,6-dibenzo-1,2-oxaphosphane-2-oxide. Other specific examples of organic phosphorus compounds include dimethyl phosphite, diphenyl phosphite, ethylphosphonic acid, diethylphosphinic acid, methylethylphosphinic acid, phenylphosphonic acid, phenylphosphinic acid, dimethylphosphinic acid, phenylphosphine, vinyl phosphoric acid and the like. One of these may be used alone, or two or more may be combined.

When synthesizing phosphorus-modified curing agent (C) from the aforementioned organic phosphorus compound and compound (F), the organic phosphorus compound and compound (F) are mixed in a reaction container for example, and reacted for 2 to 6 hours at 170° C. or more but below the decomposition temperatures of the compounds. The pressure in the reaction container in this case is lowered below atmospheric pressure, such as below 10 kPa (0.1 bar) for example, and the container is purged with a gas or volatile organic liquid as necessary during the reaction to remove by-products and the like.

The organic phosphorus compound and compound (F) are mixed in an equivalent ratio in the range of preferably 2:1 to 1:2. A catalyst, solvent or the like can also be added as necessary to the mixture of the organic phosphorus compound and compound (F).

The resulting phosphorus-modified curing agent (C) preferably has a phosphorus content of 4 to 12 mass % and a Mettler softening point of 100 to 250° C.

In the present invention, curing agent (E) containing no phosphorus atoms can also be compounded in addition to phosphorus-modified curing agent (C). A good balance of the properties necessary for a laminate or multilayer board can be obtained by compounding curing agent (E) containing no phosphorus atoms.

Specific examples of the curing agent (E) containing no phosphorus atoms used in the present invention include phenol novolac resin, cresol novolac resin and other phenol curing agents, and dicyandiamide, acid anhydride curing agents, amine curing agents and the like. One of these may be used alone, or two or more may be combined.

When polyphenylene ether compound (B) includes the aforementioned epoxy resin (B2), phosphorus-modified curing agent (C) and curing agent (E) are preferably compounded so that the stoichiometric equivalent ratio of curing agent to epoxy resin in the resin composition (equivalent of curing agents (C), (E)/equivalent of epoxy resins (A), (B2), (D)) is 0.5 to 1.5 or preferably 0.8 to 1.2. If the compounded amounts are outside this range, the cured product may have poor physical properties and the like, such as a lower glass transition temperature for example.

When polyphenylene ether compound (B) includes polyphenylene ether (B1), on the other hand, it is preferably compounded so that the stoichiometric equivalent ratio of this polyphenylene ether (B1) combined with the curing agents (curing agent (C), curing agent (E)) to the epoxy resin components (epoxy resins (A), (D)) (equivalent of polyphenylene ether (B1)+curing agent components (C), (E)/equivalent of epoxy resin components (A), (D)) is 0.5 to 1.5 or more preferably 0.8 to 1.2. Outside this range, the cured product may have poor physical properties and the like, such as a lower glass transition temperature for example.

Other components may be compounded together with components (A) to (E) above in the epoxy resin composition of the present invention as long as these do not detract from the effects of the present invention. Specific examples of such other components include inorganic filler materials, curing accelerators and the like.

An inorganic filler can improve the dielectric properties when compounded with an epoxy resin composition. Examples of inorganic fillers include molten silica and the like. Of these, one with a median particle diameter of 1 to 5 μm is preferred. The content of the inorganic filler is 35 to 350 mass % as a percentage of the resin solids in the epoxy resin composition. If the content is too low, the dielectric properties may not be sufficiently improved, while if the content is too high the other physical properties and rheological properties may be adversely affected.

In these Specifications, the "resin solids" in the epoxy resin composition are the solids (excluding inorganic filler) derived from (A) to (E) above and other resin components compounded in the epoxy resin composition.

Examples of curing accelerators include imidazoles, tertiary amines, quaternary ammonium salts, organic phosphines and the like.

The epoxy resin composition of the present invention can also be diluted with a solvent and prepared as a varnish. Specific examples of the solvent include N,N-dimethylformamide (DMF) and other amides, ethylene glycol monomethyl ether and other ethers, acetone, methylethyl ketone and other ketones, methanol, ethanol and other alcohols, and benzene, toluene and other aromatic hydrocarbons and the like.

In the epoxy resin composition of the present invention, the phosphorus content is 1.5 to 4.5 mass % or preferably 1.7 to 4.0 mass % as a percentage of the resin solids in the epoxy resin composition. Setting the phosphorus content within this range ensures that the necessary heat resistance for a laminate or multilayer board for use in an electronic or electrical device can be obtained, and that flame retardancy can be achieved without using a halogen compound containing bromine atoms or the like. If the phosphorus content is less than 1.5 mass %, it may not be possible to obtain the necessary flame retardancy for a laminate or multilayer board. If the phosphorus content is over 4.5 mass %, on the other hand, the necessary heat resistance for a laminate or multilayer board may not be obtained.

When preparing the prepreg of the present invention, the epoxy resin composition is prepared as a varnish, and a base material is impregnated with this varnish. This is then heat dried in a drier for 3 to 15 minutes at 120 to 190° C. for example to prepare a prepreg in a semi-cured state (B-stage).

In addition to glass cloth, glass paper, glass mat and other glass fiber cloth, craft paper, natural fiber cloth, organic synthetic fiber cloth and the like can be used as the base material.

When preparing the resin-coated metal foil of the present invention, the aforementioned epoxy resin composition is prepared as a varnish, and this varnish is applied to one surface of a metal foil with a roll coater or the like. This is then heat dried in a drier for 3 to 15 minutes at 120 to 190° C. for example to prepare a resin-coated metal foil in a semi-cured state (B-stage).

The thickness of the resin part of this resin-coated metal foil is 5 to 80 μm for example. For the metal foil, copper foil, aluminum foil, brass foil, nickel foil or the like can be used alone, or foil consisting of an alloy or other composite material can be used. The thickness of such a metal foil is 9 to 70 μm for example.

When preparing the resin sheet of the present invention, the aforementioned epoxy resin composition is prepared as a varnish, and this varnish is applied by casting or the like to one surface of an organic film. This is then heat dried in a drier for 1 to 40 minutes at 100 to 200° C. for example to prepare a resin sheet in a semi-cured state (B-stage).

The thickness of the resin part of a resin sheet using this organic film is 5 to 80 μm for example. The organic film is not particularly limited as long as it does not dissolve in the varnish, but for example polyester film, polyimide film or the like can be used. If the surface of the organic film is treated in advance with a release agent, workability is improved because the molded resin sheet can then be easily peeled off the organic film.

The laminate of the present invention can be manufactured by stacking the desired number of at least one selected from the prepreg, resin-coated metal foil and resin sheet described above, heating, pressing and laminate molding the stack under conditions of 140 to 220° C., 0.5 to 5.0 MPa, 40 to 240 minutes for example.

A metal-clad laminate can also be prepared by laying metal foil over the prepreg or resin sheet of the outermost layer on one or both sides, and heating, pressing and laminate molding. Copper foil, silver foil, aluminum foil, stainless steel foil or the like can be used as the metal foil.

When using a resin-coated metal foil, a metal-clad laminate can be prepared by heating, pressing and laminate molding using this as the outermost layer, with the metal foil side on the outside.

The multilayer board of the present invention can be prepared as follows. An inner-layer circuit is first formed by an additive method or subtractive method on one or both sides of the laminate, and the surface of this circuit is blackened in an acid bath or the like to prepare an inner-layer circuit board.

The desired number of at least one selected from the aforementioned prepreg, resin-coated metal foil and resin sheet is then laid over one or both sides of this inner-layer circuit board, a metal foil is laid over the outer surface as necessary, and a multilayer board is then prepared by heating, pressing and laminate molding.

A circuit is then formed by an additive or subtractive method on one or both sides of the laminate or multilayer board prepared in this way, and such steps as opening holes with a laser, drill or the like and plating the holes to form via holes and through holes can be performed as necessary to form a printed wiring board or multilayer printed wiring board.

EXAMPLES

The present invention is explained in more detail below using examples, but the present invention is not in any way limited by these examples.

The compounded ingredients of the epoxy resin composition were as follows.
(1) Epoxy Resin
(1-1) Polyfunctional Epoxy Resin (A)
(1-1-1) Polyfunctional Phosphorus-Modified Epoxy Resin (A1) [=(P)]
  Phosphorus-modified epoxy resin obtained by a reaction between novolac epoxy resin and the reaction product of 3,4,5-6-dibenzo-1,2-oxaphosphane-2-oxide and 1,4-naphthoquinone; Tohto Kasei, FX289 EK75, epoxy equivalent 315 g/eq, phosphorus content 2.2 mass %
(1-1-2) Epoxy Resin (A2) Containing No Phosphorus Atoms
  Cresol novolac epoxy resin; DIC, Epiclon N690 75M, epoxy equivalent 210 to 240 g/eq
  Phenol novolac epoxy resin; DIC, Epiclon N770 70M, epoxy equivalent 180 to 200 g/eq
(1-2) Bifunctional Epoxy Resin (D)
(1-2-1) Bifunctional Phosphorus-Modified Epoxy Resin (D1) [=(P)]
  Phosphorus-modified epoxy resin obtained by reacting a bifunctional epoxy resin with the reaction product of 3,4,5,6-dibonzo-1,2-oxaphosphane-2-oxide and 1,4-naphthoquinone; Tohto Kasei, FX305 EK70, epoxy equivalent 485
(1-2-2) Non-(D1) Bifunctional Epoxy Resin (D2)
  Bisphenol A epoxy resin; Tohto Kasei, Epotohto YD-128
(2) Polyphenylene Ether Compound
(2-1) Polyphenylene Ether (B1)
  Polyphenylene ether having a number-average molecular weight of 500 to 2000 and an average of 1.5 to 2.5 hydroxyl groups per molecule; SABIC Innovative Plastics, MX90
(2-2) Epoxy Resin (B2) Obtained by Reacting Polyphenylene Ether (B1) and Epoxy Resin (D)
  Reaction product (i) of polyphenylene ether and epoxy resin (Epotohto YD-128)
  56.95 g of polyphenylene ether (SABIC Innovative Plastics, MX90) having a number-average molecular weight of 500 to 2000 and an average of 1.5 to 2.5 hydroxyl groups per molecule, 43.05 g of bisphenol A epoxy resin (Tohto Kasei, Epotohto YD-128, containing an average of 2 epoxy groups per molecule), 0.1 g of 2-ethyl-4-methylimidazole (Shikoku Chemicals, Curezol 2E4MZ) and 70 g of toluene were placed in a flask with a cooling tube, heated at 110° C. and reacted for 5 hours to synthesize reaction product (i). The epoxy equivalent of the resulting reaction product (i) as determined in accordance with JIS K7236:1986 was 759 equivalents, and the solids concentration was 60 mass %.
  Reaction product (ii) of polyphenylene ether and epoxy resin (YX4000)
  57.47 g of polyphenylene ether (SABIC Innovative Plastics, MX90) having a number-average molecular weight of 500 to 2000 and an average of 1.5 to 2.5 hydroxyl groups per molecule, 42.53 g of biphenyl epoxy resin (Japan Epoxy Resin, YX4000, containing an average of 2 epoxy groups per molecule), 0.1 g of 2-ethyl-4-methylimidazole (Shikoku Chemicals, Curezol 2E4MZ) and 70 g of toluene were placed in a flask with a cooling tube, heated at 110° C. and reacted for 5 hours to synthesize reaction product (ii). The epoxy equivalent of the resulting reaction product (ii) as determined in accordance with JIS K7236:1986 was 768 equivalents, and the solids concentration was 60 mass %.

Reaction product (iii) of polyphenylene ether and epoxy resin (FX-305)

35.4 g of polyphenylene ether (SABIC Innovative Plastics, MX90) having a number-average molecular weight of 500 to 2000 and an average of 1.5 to 2.5 hydroxyl groups per molecule, 92.3 g of bifunctional phosphorus-modified epoxy resin (Tohto Kasei, FX305 EK70, having an average of 2 epoxy groups per molecule) from which the solvent had been removed under reduced pressure, 0.1 g of 2-ethyl-4-methylimidazole (Shikoku Chemicals, Curezol 2E4MZ) and 100 g of toluene were placed in a flask with a cooling tube, heated at 110° C. and reacted for 5 hours to synthesize reaction product (iii). The epoxy equivalent of the resulting reaction product (iii) as determined in accordance with JIS K7236:1986 was 1400 equivalents, the phosphorus content was 1.9 wt %, and the solids concentration was 50 mass %.

(2-4) High-Molecular-Weight Polyphenylene Ether (B1')

High-molecular-weight polyphenylene ether (B1') with a number-average molecular weight in excess of 4000 was synthesized by methods similar to those described in the examples of Japanese Patent Application Laid-open No. H9-124806.

That is, 100 mass parts of polyphenylene ether (SABIC Innovative Plastics, Noryl 640-111), 3 mass parts of benzoyl peroxide and 3 mass parts of bisphenol A were dissolved in 110 mass parts of toluene and reacted for 60 minutes at 90° C. to obtain high-molecular-weight polyphenylene ether, after which the polyphenylene ether skeletons in this polyphenylene ether were cleaved to reduce the molecular weight of the polyphenylene ether. When the molecular weight distribution was measured by gel permeation chromatography using a sample of the resulting polyphenylene ether dissolved in toluene, the number-average molecular weight was 4600. The OH equivalent as calculated from this value was 2875.

(2-5) Reaction Product (iv) of High-Molecular-Weight Polyphenylene Ether (B1') and Epoxy Resin 56.95 g of the polyphenylene ether (B1') obtained above, 43.05 g of bisphenol A epoxy resin (Tohto Kasei, Epotohto YD-128), 0.1 g of 2-ethyl-4-methylimidazole (Shikoku Chemicals, Curezol 2E4MZ) and 70 g of toluene were placed in a flask with a cooling tube, heated at 110° C. and reacted for 5 hours to synthesize reaction product (iv). The epoxy equivalent of the resulting reaction product (iv) as determined in accordance with JIS K7236:1986 was 3060 equivalents, and the solids content was 50 mass %.

(3) Phosphorus-Modified Curing Agent (C)

Phosphorus-modified phenol compound obtained by reacting the organic phosphorus compound of Formula (I) with compound (F) obtained by using a monomer alcohol to etherify a condensation product obtained by reacting phenols and formaldehyde in accordance with Example 8 of Japanese Translation of PCT Application No. 2008-501063

This compound was obtained as follows. 3,4,5,6-dibenzo-1,2-oxaphosphane-2-oxide and a condensation product of formaldehyde and butyl etherified phenol A were placed at a mass ratio of about 3:2 in a glass reactor equipped with a mechanical stirrer and a heating gasket, and a nitrogen gas inlet, a condenser and a solvent collector were attached. The mixture was heated from 96° C. to 199° C. for 180 minutes. Butanol was collected in stages as the temperature rose. The reaction mixture was maintained at 200° C. for 20 minutes until no more volatile components were released from the reaction mixture. The resulting solid material was removed from the reactor. The Tg as measured by DSC was 108.5° C. The resulting product was believed to be a blend of oligomers in which one oligomer had a structure comprising four of the organic phosphorus compounds of Formula (I) bound to bisphenol A.

(4) Curing Agent (E) Containing No Phosphorus Atoms
Dicyandiamide
Phenol novolac phenol resin, DIC, phenolite TD2090 60M (5) Inorganic Filler
Molten silica, Tatsumori Co., Fuselex AS-1, median particle diameter 3.2 μm (6) Curing Accelerator
2-ethyl-4-methylimidazole, Shikoku Chemicals, Curezol 2E4MZ (7) Solvent
Dimethylformamide (DMF)
Toluene A glass cloth (Nitto Boseki Co., WEA7628) was impregnated with epoxy resin composition (varnish) obtained by compounding the above components in the proportions (mass parts) shown in Tables 1 to 4, and then heat dried for 3 minutes in a drier at 160° C. to prepare a semi-cured B-stage prepreg.

Eight of the resulting prepregs were stacked, sandwiched between two sheets of copper foil (Nikko Gould Foil, 18 μm-thick JTC foil), and heated and molded under pressure for 120 minutes under conditions of 200° C., 30 MPa to prepare a copper-clad laminate.

The resulting copper-clad laminate was evaluated as follows.

[Flame Retardancy]

The copper foil was removed from the copper-clad laminate (thickness 1.6 mm), and a test piece 125 mm long and 12.5 mm wide was cut out. The combustion behavior of this test piece was evaluated in accordance with Underwriters Laboratories "Test for Flammability of Plastic Material UL94".

[Dielectric Properties (Dielectric Constant, Dielectric Tangent)]

For the dielectric properties (high-frequency properties), the dielectric constant and dielectric tangent (1 GHz) were measured in accordance with JIS C 6481.

[Glass Transition Temperature (Tg)]

The glass transition temperature of the copper-clad laminate prepared above was measured by DSC (differential scanning calorimetry) in accordance with JIS C 6481.

[Heat Resistance (Thermal Decomposition Temperature)]

The copper foil was stripped from the copper-clad laminate prepared above, which was then measured with a thermogravimetric/differential thermal analyzer (TG-DTA) at a program rate of 5° C./minute, and the temperature at which the weight loss was 5% of the original weight was given as the thermal decomposition temperature.

[Interlayer Adhesiveness (Delamination Strength)]

A test piece 10 mm long by 100 mm wide was cut out of the resulting copper-clad laminate. Delamination strength was then measured by the following method using a peeling tester (Shimadzu compact tabletop EZTest tester). A layer of prepreg immediately under the copper foil of the test pieces was peeled to a suitable length and attached to a supporting bracket, and the tip was pinched with a jig and pulled continuously at a rate of 50 mm a minute in a direction perpendicular to the surface of the prepreg to peel about 50 mm. The minimum weight during this process was given as the delamination strength between prepregs.

[Compatibility]

The condition of the epoxy resin composition was observed with the naked eye, and the molded copper-clad laminate was cut, and the cut cross-section was polished and observed by scanning electron microscopy (SEM) to confirm compatibility.

The evaluation results are shown in Tables 1 to 4.

TABLE 1

| | | | Solids | E1 | E2 | E3 | E4 | E5 | E6 | E7 | E8 |
|---|---|---|---|---|---|---|---|---|---|---|---|
| A: Polyfunctional epoxy resin | Polyfunctional phosphorus-modified epoxy resin | A1 (P): Tohto Kasei polyfunctional phosphorus-modified epoxy resin FX289 EK75 | 75% | 33.9 | 66.5 | 50.9 | 107.5 | 66.3 | 79.2 | 66.5 | 66.5 |
| | Epoxy resin without phosphorus atoms | A2: DIC cresol novolac epoxy resin Epiclon N690 75M | 75% | 13.3 | 26.7 | — | — | — | — | 26.7 | 26.7 |
| | | A2: DIC phenol novolac epoxy resin Epiclon N770 70M | 70% | — | — | — | — | 28.6 | — | — | — |
| D: Bifunctional epoxy resin | Bifunctional phosphorus-modified epoxy resin | D1 (P): Tohto Kasei FX305 EK70 | 70% | — | — | — | — | — | — | — | — |
| | Bifunctional epoxy resin | D2: Tohto Kasei YD128 | 100% | — | — | — | — | — | — | — | — |
| B: Polyphenylene ether compound | Polyphenylene ether | B1: SABIC Innovative Plastics polyphenylene ether MX-90 | 100% | 56.2 | 20.0 | 51.5 | 15.0 | 20.0 | 20.0 | 20.0 | 20.0 |
| | | B1': polyphenylene ether (SABIC Innovative Plastics molecularly cleaved Noryl 640-111, molecular weight 4600) | 50% | — | — | — | — | — | — | — | — |
| | Reaction product of polyphenylene ether and epoxy resin (D) | B2: Reaction product (i) of B1 & YD128 | 60% | — | — | — | — | — | — | — | — |
| | | B2: Reaction product (ii) of B1 & YX4000 | 60% | — | — | — | — | — | — | — | — |
| | | B2 (P): Reaction product (iii) of B1 & FX305 | 60% | — | — | — | — | — | — | — | — |
| | | B2': Reaction product (iv) of B1' and YD128 | 50% | — | — | — | — | — | — | — | — |
| C: Phosphorus-modified curing agent | | C: Phosphorus-modified phenol compound, per Japanese Translation of PCT Application No. 2008-501063, Ex. 8 | 100% | 8.4 | 8.0 | 10.3 | 2.0 | 8.1 | 6.2 | 8.0 | 8.0 |
| E: Curing agent without phosphorus atoms | | E: Dicyandiamide | 100% | — | 2.1 | — | 2.3 | 2.2 | — | 2.1 | 2.1 |
| | | E: DIC phenol novolac resin TD2090 60M | 60% | — | — | — | — | — | 24.1 | — | — |
| Molten silica Tatsumori Fuselex As-1 | | | | — | — | — | — | — | — | 35.0 | 350.0 |
| Shikoku Chemicals 2E4MZ | | | | 0.1 | 0.1 | 0.1 | 0.1 | 0.1 | 0.1 | 0.1 | 0.1 |
| DMF | | | | — | 16.8 | — | 10.0 | 17.6 | — | 30.0 | 200.0 |
| Toluene | | | | 54.0 | 26.6 | 54.0 | 20.0 | 23.9 | 37.3 | 26.6 | 26.6 |
| Phosphorus content | | | | 1.5 | 2.0 | 2.0 | 2.0 | 2.0 | 2.0 | 2.0 | 2.0 |
| EVALUATION RESULTS | Flame retardancy (1.6 mm board) | | | 94V-0 | 94V-0 | 94V-0 | 94V-0 | 94V-0 | 94V-0 | 94V-0 | 94V-0 |
| | Dielectric constant (1 GHz) | | | 3.62 | 4.18 | 4.09 | 4.26 | 4.18 | 4.18 | 4.18 | 4.18 |
| | Dielectric tangen (1 GHz) | | | 0.011 | 0.010 | 0.010 | 0.010 | 0.010 | 0.011 | 0.009 | 0.008 |
| | Tg (° C.) | | | 165 | 172 | 168 | 168 | 171 | 165 | 172 | 172 |
| | Thermal decomposition temperature (° C.) | | | 332 | 326 | 325 | 327 | 326 | 327 | 327 | 324 |
| | Delamination strength (kN/m) | | | 0.94 | 1.05 | 0.93 | 0.98 | 1.07 | 1.11 | 0.98 | 0.87 |
| | Compatibility (SI = Sea-island) | | | SI | SI | SI | SI | SI | SI | SI | SI |

TABLE 2

| | | | Solids | E9 | E10 | CE1 | CE2 | CE3 | CE4 | CE5 |
|---|---|---|---|---|---|---|---|---|---|---|
| A: Polyfunctional epoxy resin | Polyfunctional phosphorus-modified epoxy resin | A1 (P): Tohto Kasei polyfunctional phosphorus-modified epoxy resin FX289 EK75 | 75% | 72.9 | 75.3 | 63.2 | 40.1 | 66.0 | 41.9 | 91.1 |
| | Epoxy resin without phosphorus atoms | A2: DIC cresol novolac epoxy resin Epiclon N690 75M | 75% | — | 20.0 | 13.3 | 10.1 | — | 26.7 | 26.7 |
| | | A2: DIC phenol novolac epoxy resin Epiclon N770 70M | 70% | — | — | — | — | — | — | — |

TABLE 2-continued

|  |  |  | Solids | E9 | E10 | CE1 | CE2 | CE3 | CE4 | CE5 |
|---|---|---|---|---|---|---|---|---|---|---|
| D: Bifunctional epoxy resin | Bifunctional phosphorus-modified epoxy resin | D1 (P): Tohto Kasei FX305 EK70 | 70% | — | — | — | — | — | — | — |
|  | Bifunctional epoxy resin | D2: Tohto Kasei YD128 | 100% | — | 6.5 | — | — | — | — | — |
| B: Polyphenylene ether compound | Polyphenylene ether | B1: SABIC Innovative Plastics polyphenylene ether MX-90 | 100% | 15.0 | 8.5 | — | 62.4 | 15.0 | — | 1.5 |
|  |  | B1': polyphenylene ether (SABIC Innovative Plastics molecularly cleaved Noryl 640-111, molecular weight 4600) | 50% | — | — | — | — | — | 26.4 | — |
|  | Reaction product of polyphenylene ether and epoxy resin (D) | B2: Reaction product (i) of B1 & YD128 | 60% | — | — | — | — | — | — | — |
|  |  | B2: Reaction product (ii) of B1 & YX4000 | 60% | — | — | — | — | — | — | — |
|  |  | B2 (P): Reaction product (iii) of B1 & FX305 | 60% | — | — | — | — | — | — | — |
|  |  | B2': Reaction product (iv) of B1' and YD128 | 50% | — | — | — | — | — | — | — |
| C: Phosphorus-modified curing agent |  | C: Phosphorus-modified phenol compound, per Japanese Translation of PCT Application No. 2008-501063, Ex. 8 | 100% | 29.3 | 11.2 | 1.0 | — | 34.8 | 9.6 | — |
| E: Curing agent without phosphorus atoms |  | E: Dicyandiamide | 100% | 1.0 | 2.3 | — | — | 0.7 | 0.1 | 3.5 |
|  |  | E: DIC phenol novolac resin TD2090 60M | 60% | — | — | 43.0 | — | — | — | — |
| Molten silica Tatsumori Fuselex As-1 |  |  |  | — | — | — | — | — | — | — |
| Shikoku Chemicals 2E4MZ |  |  |  | 0.1 | 0.1 | — | — | 0.1 | 0.1 | 0.1 |
| DMF |  |  |  | 15.7 | 13.0 | 38.0 | — | 15.0 | 20.0 | 38.0 |
| Toluene |  |  |  | 20.0 | 17.1 | — | — | 20.0 | 35.0 | — |
| Phosphorus content |  |  |  | 4.5 | 2.5 | 1.5 | 0.9 | 5.0 | 2.0 | 1.5 |
| EVALUATION RESULTS | Flame retardancy (1.6 mm board) |  |  | 94V-0 | 94V-0 | 94V-1 | 94V-1 | 94V-0 | Incompatible, not measured | 94V-1 |
|  | Dielectric constant (1 GHz) |  |  | 4.26 | 4.38 | 4.49 | 3.39 | 4.26 |  | 4 45 |
|  | Dielectric tangent (1 GHz) |  |  | 0.010 | 0.010 | 0.011 | 0.011 | 0.010 |  | 0.011 |
|  | Tg (° C.) |  |  | 156 | 167 | 163 | 131 | 163 |  | 150 |
|  | Thermal decomposition temperature (° C.) |  |  | 308 | 321 | 332 | 339 | 297 |  | 321 |
|  | Delamination strength (kN/m) |  |  | 0.97 | 0.99 | 1.05 | 0.46 | 0.99 |  | 1.17 |
|  | Compatibility (SI = Sea-island) (IS = Incompatible/separated) (CO = Compatible) |  |  | SI | SI | CO | SI | CO | IS | CO |

TABLE 3

|  |  |  | Solids | E21 | E22 | E23 | E24 | E25 | E26 | E27 | E28 |
|---|---|---|---|---|---|---|---|---|---|---|---|
| A: Polyfunctional epoxy resin | Polyfunctional phosphorus-modified epoxy resin | A1 (P): Tohto Kasei polyfunctional phosphorus-modified epoxy resin FX289 EK75 | 75% | 43.8 | 64.9 | 75.2 | 75.2 | 75.1 | 99.8 | 99.8 | 99.8 |
|  | Epoxy resin without phosphorus atoms | A2: DIC cresol novolac epoxy resin Epiclon N690 75M | 75% | 30.0 | 40.0 | 20.0 | 20.0 | — | — | — | — |
|  |  | A2: DIC phenol novolac epoxy resin Epiclon N770 70M | 70% | — | — | — | — | 21.4 | — | — | — |
| D: Bifunctional epoxy resin | Bifunctional phosphorus-modified epoxy resin | D1 (P): Tohto Kasei FX305 EK70 | 70% | — | — | — | — | — | — | — | — |
|  | Bifunctional epoxy resin | D2: Tohto Kasei YD128 | 100% | — | — | — | — | — | — | — | — |
| B: Polyphenylene ether compound | Polyphenylene ether | B1: SABIC Innovative Plastics polyphenylene ether MX-90 | 100% | — | — | — | — | — | — | — | — |
|  |  | B1': polyphenylene ether (SABIC Innovative Plastics molecularly cleaved Noryl 640-111, molecular weight 4600) | 50% | — | — | — | — | — | — | — | — |

TABLE 3-continued

|  |  |  | Solids | E21 | E22 | E23 | E24 | E25 | E26 | E27 | E28 |
|---|---|---|---|---|---|---|---|---|---|---|---|
|  | Reaction product of polyphenylene ether and epoxy resin (D) | B2: Reaction product (i) of B1 & YD128 | 60% | 25.0 | 25.0 | 25.0 | — | 25.0 | 25.0 | 25.0 | 25.0 |
|  |  | B2: Reaction product (ii) of B1 & YX4000 | 60% | — | — | — | 25.0 | — | — | — | — |
|  |  | B2 (P): Reaction product (iii) of B1 & FX305 | 60% | — | — | — | — | — | — | — | — |
|  |  | B2': Reaction product (iv) of B1' and YD128 | 50% | — | — | — | — | — | — | — | — |
| C: Phosphorus-modified curing agent | C: Phosphorus-modified phenol compound, per Japanese Translation of PCT Application No. 2008-501063, Ex. 8 |  | 100% | 6.9 | 3.8 | 11.2 | 11.2 | 11.2 | 7.6 | 7.6 | 7.6 |
| E: Curing agent without phosphorus atoms | E: Dicyandiamide |  | 100% | — | 2.5 | 2.4 | 2.4 | 2.4 | 2.6 | 2.6 | 2.6 |
|  | E: DIC phenol novolac resin TD2090 60M |  | 60% | 37.9 | — | — | — | — | — | — | — |
| Molten silica Tatsumori Fuselex As-1 |  |  |  | — | — | — | — | — | — | 35.0 | 350.0 |
| Shikoku Chemicals 2E4MZ |  |  |  | 0.1 | 0.1 | 0.1 | 0.1 | 0.1 | 0.1 | 0.1 | 0.1 |
| DMF |  |  |  | 10.3 | 17.7 | 20.1 | 20.1 | 18.7 | 18.9 | 37.7 | 207.4 |
| Toluene |  |  |  | — | — | — | — | — | — | — | — |
| Phosphorus content |  |  |  | 1.5 | 1.5 | 2.5 | 2.5 | 2.5 | 2.5 | 2.5 | 2.5 |
| EVALUATION RESULTS | Flame retardancy (1.6 mm board) |  |  | 94V-0 | 94V-0 | 94V-0 | 94V-0 | 94V-0 | 94V-0 | 94V-0 | 94V-0 |
|  | Dielectric constant (1 GHz) |  |  | 4.36 | 4.38 | 4.38 | 4.38 | 4.38 | 4.37 | 4.37 | 4.37 |
|  | Dielectric tangent (1 GHz) |  |  | 0.010 | 0.010 | 0.010 | 0.010 | 0.010 | 0.010 | 0.009 | 0.008 |
|  | Tg (° C.) |  |  | 172 | 173 | 168 | 168 | 170 | 165 | 165 | 165 |
|  | Thermal decomposition temperature (° C.) |  |  | 336 | 337 | 320 | 321 | 322 | 321 | 320 | 320 |
|  | Delamination strength (kN/m) |  |  | 1.08 | 1.10 | 1.14 | 1.14 | 1.14 | 1.15 | 1.14 | 1.11 |
|  | Compatibility (CO = compatible) |  |  | CO | CO | CO | CO | CO | CO | CO | CO |

TABLE 4

|  |  |  | Solids | E29 | E30 | E31 | E32 | CE21 | CE22 | CE23 | CE24 | CE25 |
|---|---|---|---|---|---|---|---|---|---|---|---|---|
| A: Polyfunctional epoxy resin | Polyfunctional phosphorus-modified epoxy resin | A1 (P): Tohto Kasei polyfunctional phosphorus-modified epoxy resin FX289 EK75 | 75% | 11.4 | 72.1 | — | — | 37.8 | 64.9 | 69.0 | 65.2 | 18.4 |
|  | Epoxy resin without phosphorus atoms | A2: DIC cresol novolac epoxy resin Epiclon N690 75M | 75% | — | — | 53.3 | 60.0 | 50.0 | 60.0 | 45.0 | — | — |
|  |  | A2: DIC phenol novolac epoxy resin Epiclon N770 70M | 70% | — | — | — | — | — | — | — | — | — |
| D: Bifunctional epoxy resin | Bifunctional phosphorus-modified epoxy resin | D1 (P): Tohto Kasei FX305 EK70 | 70% | — | — | — | 37.8 | — | — | — | — | — |
|  | Bifunctional epoxy resin | D2: Tohto Kasei YD128 | 100% | — | — | — | — | — | — | — | — | — |
| B: Polyphenylene ether compound | Polyphenylene ether | B1: SABIC Innovative Plastics polyphenylene ether MX-90 | 100% | — | — | — | — | — | — | — | — | — |
|  |  | B1': polyphenylene ether (SABIC Innovative Plastics molecularly cleaved Noryl 640-111, molecular weight 4600) | 50% | — | — | — | — | — | — | — | — | — |
|  | Reaction product of polyphenylene ether and epoxy resin (D) | B2: Reaction product (i) of B1 & YD128 | 60% | 116.7 | 25.0 | — | 20.0 | — | — | — | 25.0 | — |
|  |  | B2: Reaction product (ii) of B1 & YX4000 | 60% | — | — | — | — | — | — | — | — | — |
|  |  | B2 (P): Reaction product (iii) of | 60% | — | — | 107.2 | — | — | — | — | — | — |

TABLE 4-continued

|  |  | Solids | E29 | E30 | E31 | E32 | CE21 | CE22 | CE23 | CE24 | CE25 |
|---|---|---|---|---|---|---|---|---|---|---|---|
|  | B1 & FX305 B2': Reaction product (iv) of B1' and YD128 | 50% | — | — | — | — | — | — | — | — | 25.0 |
| C: Phosphorus-modified curing agent | C: Phosphorus-modified phenol compound, per Japanese Translation of PCT Application No. 2008-501063, Ex. 8 | 100% | 20.6 | 29.5 | 4.1 | 6.3 | 7.8 | 3.8 | 12.1 | 34.9 | 14.2 |
| E: Curing agent without phosphorus atoms | E: Dicyandiamide | 100% | 0.9 | 1.5 | 2.3 | 2.2 | — | 2.5 | 2.4 | 1.2 | 2.4 |
|  | E: DIC phenol novolac resin TD2090 60M | 60% | — | — | — | — | 43.9 | — | — | — | — |
| Molten silica Tatsumori Fuselex As-1 |  |  | — | — | — | — | — | — | — | — | — |
| Shikoku Chemicals 2E4MZ |  |  | 0.1 | 0.1 | 0.1 | 0.1 | 0.1 | 0.1 | 0.1 | 0.1 | 0.1 |
| DMF |  |  | 4.4 | 25.9 | 5.0 | — | 15.9 | 22.7 | 25.4 | 27.6 | 20.0 |
| Toluene |  |  | — | — | — | 25.5 | — | — | — | — | 35.0 |
| Phosphorus content |  |  | 2.5 | 4.5 | 1.5 | 1.5 | 1.5 | 1.5 | 2.5 | 5.0 | 1.5 |
| EVALUATION RESULTS | Flame retardancy (1.6 mm board) |  | 94V-0 | 94V-0 | 94V-0 | 94V-0 | 94V-1 | 94V-1 | 94V-0 | 94V-0 | Incompatible, not measured |
|  | Dielectric constant (1 GHz) |  | 3.94 | 4.38 | 4.39 | 4.18 | 4.49 | 4.50 | 4.50 | 4.38 |  |
|  | Dielectric tangent (1 GHz) |  | 0.009 | 0.010 | 0.010 | 0.010 | 0.010 | 0.010 | 0.010 | 0.010 |  |
|  | Tg (° C.) |  | 149 | 156 | 154 | 174 | 174 | 177 | 173 | 162 |  |
|  | Thermal decomposition temperature (° C.) |  | 321 | 308 | 319 | 325 | 335 | 336 | 322 | 297 |  |
|  | Delamination strength (kN/m) |  | 0.94 | 1.10 | 1.10 | 1.06 | 1.05 | 1.09 | 1.10 | 0.95 |  |
|  | Compatibility (IS = Incompatible/separated) (CO = Compatible) |  | CO | CO | CO | CO | CO | CO | CO | CO | IS |

Tables 1 and 2 show that the desired flame retardancy was ensured, heat resistance was also obtained and the dielectric properties were improved in Examples 1 to 10, in which polyfunctional phosphorus-modified epoxy resin (A1), polyphenylene ether (B1) and phosphorus-modified curing agent (C) were compounded and the phosphorus content was 1.5 to 4.5 mass % as a percentage of the resin solids in the epoxy resin composition. Because polyphenylene ether (B1) has a low molecular weight, moreover, it was possible to control the occurrence of phase separation, which is likely in compounded systems containing phosphorus and systems compounded with polyphenylene ether compound (B). In Examples 7 and 8, which were compounded with an inorganic filler material, the dielectric tangent was even lower than in Example 2, in which no inorganic filler material was compounded.

When polyphenylene ether (B1) was used as polyphenylene ether compound (B), a sea-island structure was formed because the curing agent did not dissolve together with the resin components, but they were not immiscible and did not separate, so good results were still obtained in terms of the delamination strength of the resulting copper-clad laminate and the like.

In Comparative Example 1 having no compounded polyphenylene ether compound (B), on the other hand, the desired flame retardancy could no be ensured even when the phosphorus content was 1.5 mass % as a percentage of the resin solids in the epoxy resin composition, and the dielectric constant was also much higher.

In Comparative Example 2, in which polyphenylene ether compound (B) was compounded but not phosphorus-modified curing agent (C) and curing agent (E) containing no phosphorus atoms, interlayer adhesiveness was lower and flame retardancy was further reduced.

Heat resistance was reduced in Comparative Example 3, in which the phosphorus content exceeded 4.5 mass % as a percentage of the resin solids in the epoxy resin composition.

In Comparative Example 4 using high-molecular-weight polyphenylene ether (B1'), immiscibility and separation occurred, and it was not possible to prepare a varnish or a prepreg. Therefore, no evaluation was done in this case.

In Comparative Example 5 containing no phosphorus-containing curing agent (C), the Tg was low at 150° C., and the heat resistance also tended to be low due to the high content of dicyandiamide. The dielectric properties were also poor because the amount of polyphenylene ether compound (B) was smaller.

Tables 3 and 4 show that the desired flame retardancy was ensured, heat resistance was obtained and the dielectric properties were improved in Examples 21 to 31, in which polyfunctional epoxy resin (A), polyphenylene ether compound (B), phosphorus-modified curing agent (C) and curing agent (E) containing no phosphorus atoms were compounded, with polyphenylene ether compound (B) being epoxy resin (B2) (i), (ii) or (iii), which was a reaction product of polyphenylene ether and epoxy resin (D), and in which the phosphorus content was 1.5 to 4.5 mass % as a percentage of the resin solids in the epoxy resin composition. It was also possible to control the occurrence of phase separation, which is likely in compounded systems containing phosphorus and systems compounded with polyphenylene ether compound (B), and compatibility was confirmed in the resulting cured resins. The dielectric tangent was smaller in Examples 27 and 28 compounded with an inorganic filler material than in Example 26 without an inorganic filler material.

Flame retardancy was ensured, heat resistance was obtained and the dielectric properties were improved in Example 32, in which bifunctional phosphorus-modified epoxy resin (D1), polyphenylene ether compound (B) and phosphorus-modified curing agent (C) were compounded, with polyphenylene ether compound (B) being epoxy resin (B2) (i), which was a reaction product of polyphenylene ether and epoxy resin (D), and in which the phosphorus content was 1.5 mass % as a percentage of the resin solids in the epoxy resin composition. It was also possible to control the occurrence of phase separation, which is likely in compounded systems containing phosphorus and systems compounded with polyphenylene ether compound (B), and compatibility was confirmed in the resulting cured resin.

One problem that has occurred with conventional polyphenylene ether curing agents having hydroxyl groups is that phase separation occurs in resin systems using phosphorus-modified epoxy resin, so that the reaction between the epoxy resin and the polyphenylene ether curing agent does not proceed smoothly in some places. In Examples 1 to 11, however, good laminates were obtained even though a sea-island structure was formed, while in Examples 21 to 32, compatibility was better and good laminates were obtained without the formation of a sea-island structure.

In Comparative Examples 21 and 22, in which only polyfunctional epoxy resin (A), phosphorus-modified curing agent (C) and curing agent (E) without phosphorus atoms were compounded, without any polyphenylene ether compound (B), and in which the phosphorus content was adjusted to 1.5 mass % as a percentage of the resin solids in the epoxy resin composition, compatibility was confirmed in the resulting laminates, but the desired flame retardancy could not be ensured, and the dielectric constants were much higher.

In Comparative Example 23, in which polyfunctional epoxy resin (A), phosphorus-modified curing agent (C) and curing agent (E) containing no phosphorus atoms were compounded and the phosphorus content was adjusted to 2.5 mass % as a percentage of the resin solids in the epoxy resin composition, flame retardancy was ensured, but the dielectric constant was poor because of the absence of polyphenylene ether compound (B).

Heat resistance was lower in Comparative Example 24, in which epoxy resin (B2) containing polyphenylene ether, which was reaction product (i) of polyphenylene ether (B1) and epoxy resin (D), was compounded as polyphenylene ether compound (B), and in which the phosphorus content was in excess of 4.5 mass % as a percentage of the resin solids in the epoxy resin composition.

In Comparative Example 25 using reaction product (iv) of high-molecular-weight polyphenylene ether (B1') and epoxy resin (D), immiscibility and separation occurred, and it was impossible to prepare a varnish or a prepreg. Therefore, the evaluations described above were not performed.

The invention claimed is:
1. An epoxy resin composition containing:
a polyfunctional epoxy resin (A);
a polyphenylene ether compound (B);
a phosphorus-modified curing agent (C); and
a component other than (A), (B) and (C), wherein:
the polyfunctional epoxy resin (A) includes an average of 3 or more epoxy groups per molecule,
the polyphenylene ether compound (B) includes an epoxy resin (B2) obtained by reacting a polyphenylene ether (B1) with an epoxy resin (D), the epoxy resin (D) having an average of 2.3 or fewer epoxy groups per molecule, and the polyphenylene ether (B1) having a number-average molecular weight of 500 to 2000 and an average of 1.0 to 3.0 hydroxyl group per molecule,
at least one selected the group consisting of the polyfunctional epoxy resin (A), the epoxy resin (D), and the component other than the (A), (B) and (C) includes a phosphorus-modified epoxy resin (P), the phosphorus content is 1.5 to 4.5 mass % as a percentage of resin solids in the epoxy resin composition,
the phosphorus-modified curing agent (C) is a resultant in a reaction between a first compound and an organic phosphorus second compound of the following Formula (I);
the first compound is a resultant in an etherification between at least one monomer alcohol and a condensation product,
the condensation product is a resultant in a condensation between formaldehyde and a phenol compound,

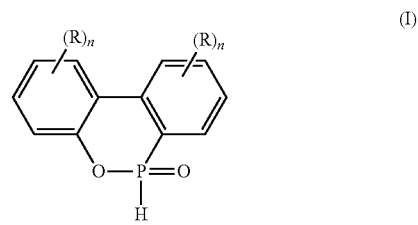

wherein each R independently represents hydrogen or a $C_{1-6}$ hydrocarbon group, and n is an integer from 0 to 4,
a solids content of the phosphorus-modified curing agent (C) falls within a range of 3.9 to 43 mass % with respect to solids mass of the polyfunctional epoxy resin (A) and the polyphenylene ether compound (B), and
the polyfunctional epoxy resin (A), the polyphenylene ether compound (B) and the phosphorus-modified epoxy resin (P) are miscible.

2. The epoxy resin composition according to claim 1, wherein the polyphenylene ether (B1) has an average of 1.5 to 2.5 hydroxyl groups per molecule.

3. The epoxy resin composition according to claim 2, wherein the phosphorus-modified epoxy resin (P) is obtained by reacting an epoxy resin including a novolac epoxy resin or a bifunctional epoxy resin with a reaction product of a quinone compound and an organic phosphorus compound represented by Formula (I) below:

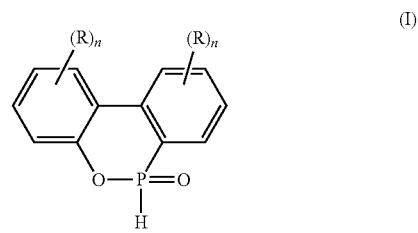

wherein each R independently represents hydrogen or a $C_{1-6}$ hydrocarbon group, and n is an integer from 0 to 4.

4. The epoxy resin composition according to claim 2, wherein the polyfunctional epoxy resin (A) includes at least one of a cresol novolac epoxy resin and a phenol novolac epoxy resin.

5. The epoxy resin composition according to claim 2, wherein the component other than (A), (B) and (C) includes the epoxy resin (D) having an average of 2.3 or fewer epoxy groups per molecule, and
the solids content of the phosphorus-modified curing agent (C) is 11.05 mass % with respect to solids mass of the polyfunctional epoxy resin (A) and the polyphenylene ether compound (B).

6. The epoxy resin composition according to claim 2, further including a curing agent (E) containing no phosphorus atoms.

7. The epoxy resin composition according to claim 2, further including an inorganic filler in an amount of 35 to 350 mass % of the resin solids in the epoxy resin composition.

8. The epoxy resin composition according to claim 1, wherein the phosphorus-modified epoxy resin (P) is obtained by reacting an epoxy resin including a novolac epoxy resin or a bifunctional epoxy resin with a reaction product of a quinone compound and an organic phosphorus compound represented by Formula (1) below:

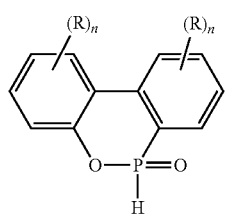

(I)

wherein each R independently represents hydrogen or a $C_{1-6}$ hydrocarbon group, and n is an integer from 0 to 4.

9. The epoxy resin composition according to claim 8, wherein the polyfunctional epoxy resin (A) includes at least one of a cresol novolac epoxy resin and a phenol novolac epoxy resin.

10. The epoxy resin composition according to claim 1, wherein the polyfunctional epoxy resin (A) includes at least one of a cresol novolac epoxy resin and a phenol novolac epoxy resin.

11. The epoxy resin composition according to claim 1, wherein the component other than (A), (B) and (C) includes the epoxy resin (D having an average of 2.3 or fewer epoxy groups per molecule, and
the solids content of the phosphorus-modified curing agent (C) is 11.05 mass % with respect to solids mass of the polyfunctional epoxy resin (A) and the polyphenylene ether compound (B).

12. The epoxy resin composition according to claim 11, further including a curing agent (E) containing no phosphorus atoms.

13. The epoxy resin composition according to claim 12, further including an inorganic filler in an amount of 35 to 350 mass % of the resin solids in the epoxy resin composition.

14. The epoxy resin composition according to claim 11, further including an inorganic filler in an amount of 35 to 350 mass % of the resin solids in the epoxy resin composition.

15. The epoxy resin composition according to claim 1, further including a curing agent (E) containing no phosphorus atoms.

16. The epoxy resin composition according to claim 15, further including an inorganic filler in an amount of 35 to 350 mass % of the resin solids in the epoxy resin composition.

17. The epoxy resin composition according to claim 1, further including an inorganic filler in an amount of 35 to 350 mass % of the resin solids in the epoxy resin composition.

18. A prepreg, obtained by drying a base material that has been impregnated with the epoxy resin composition according to claim 1.

19. A resin-coated metal foil, obtained by drying a metal foil that has been coated with the epoxy resin composition according to claim 1.

20. A resin sheet, obtained by drying an organic film that has been coated with the epoxy resin composition according to claim 1.

21. A laminate, comprising a desired number of at least one selected from a prepreg obtained by drying a base material that has been impregnated with the epoxy resin composition according to claim 1, a resin-coated metal foil obtained by drying a metal foil that has been coated with the epoxy resin composition according to claim 1 and a resin sheet obtained by drying an organic film that has been coated with the epoxy resin composition according to claim 1, which have been stacked, heated, pressed and laminate molded.

22. A multilayer board, comprising at least one selected from a prepreg obtained by drying a base material that has been impregnated with the epoxy resin composition according to claim 1, a resin-coated metal foil obtained by drying a metal foil that has been coated with the epoxy resin composition according to claim 1 and a resin sheet obtained by drying an organic film that has been coated with the epoxy resin composition according to claim 1, which have been laid over an inner-layer circuit board, and heated, pressed and laminate molded.

23. The epoxy resin composition according to claim 1, wherein an epoxy equivalent of the phosphorus-modified epoxy resin (P) is 200 g/eq to 600 g/eq.

24. The epoxy resin composition according to claim 1, wherein the epoxy resin (B2) has an average of 2.3 or fewer epoxy groups per molecule.

25. The epoxy resin composition according to claim 1, wherein the polyfunctional epoxy resin (A) includes the phosphorus-modified epoxy resin (P).

26. The epoxy resin composition according to claim 1, wherein:
the polyfunctional epoxy resin (A) includes the phosphorus-modified epoxy resin (P), and
the phosphorus-modified epoxy resin (P) is obtained by reacting an epoxy resin including a novolac epoxy resin or a bifunctional epoxy resin with a reaction product of a quinone compound and an organic phosphorus compound represented by Formula (1) below:

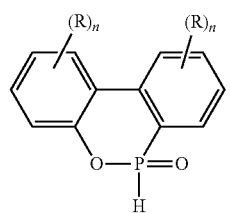

(I)

wherein each R independently represents hydrogen or a $C_{1-6}$ hydrocarbon group, and n is an integer from 0 to 4.

27. The epoxy resin composition according to claim 1, wherein:
the polyfunctional epoxy resin (A) includes the phosphorus-modified epoxy resin (P) and an epoxy resin including no phosphorous atoms, and the epoxy resin including no phosphorous atoms includes a cresol novolac epoxy resin.

28. The epoxy resin composition according to claim 1, wherein:
   the epoxy resin (D) includes the phosphorus-modified epoxy resin (P), and
   the phosphorus-modified epoxy resin (P) includes a bifunctional phosphorous-modified epoxy resin.

29. The epoxy resin composition according to claim 1, wherein:
   the component other than the (A), (B) and (C) includes the phosphorus-modified epoxy resin (P), and
   the phosphorus-modified epoxy resin (P) includes a bifunctional phosphorous-modified epoxy resin.

30. The epoxy resin composition according to claim 1, further containing:
   a curing agent (E) including no phosphorus atoms; and
   a solvent, wherein
the solvent includes N, N-dimethylformamide.

* * * * *